United States Patent
da Silveira et al.

(10) Patent No.: US 7,248,656 B2
(45) Date of Patent: Jul. 24, 2007

(54) DIGITAL CONVERTIBLE RADIO SNR OPTIMIZATION

(75) Inventors: Marthinus W. da Silveira, Nepean (CA); M. Neil McGowan, Stittsville (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 706 days.

(21) Appl. No.: 10/670,426

(22) Filed: Sep. 24, 2003

(65) Prior Publication Data

US 2004/0228422 A1 Nov. 18, 2004

Related U.S. Application Data

(63) Continuation-in-part of application No. 10/307,624, filed on Dec. 2, 2002.

(51) Int. Cl.
*H03D 1/04* (2006.01)
(52) U.S. Cl. .................................................. 375/346
(58) Field of Classification Search ................ 375/299, 375/295, 296, 297, 347, 259, 260, 346, 349
See application file for complete search history.

(56) References Cited

U.S. PATENT DOCUMENTS 5,834,972 A * 11/1998 Schiemenz et al. ..... 330/124 R
6,445,343 B1 * 9/2002 Pietrusiak ................... 342/368
6,728,307 B1 * 4/2004 Derryberry et al. ......... 375/219
6,983,026 B2 * 1/2006 Pinckley et al. ............ 375/296
7,116,723 B2 * 10/2006 Kim et al. ................... 375/267
2003/0214355 A1 * 11/2003 Luz et al. ............... 330/124 R
2004/0032910 A1 * 2/2004 Horng et al. ................ 375/267

* cited by examiner

*Primary Examiner*—Emmanuel Bayard
(74) *Attorney, Agent, or Firm*—Garlick Harrison & Markison; James A. Harrison

(57) ABSTRACT

A digital convertible radio optimizes signal-to-noise ratios by substantially canceling undesired components of a plurality of input data streams present in sector signals in a cellular network. The sector output power is then scaled to optimize the total power at the sector output ports. The input data streams are cross-correlated with each other and with digital representations of the sector signals to produce a plurality of cross-correlated signals. The plurality of cross-correlated signals is combined to identify the undesired cross-correlated signals. The portion of the undesired signal measurement representing the correlation between the input signal streams are removed using the input signal cross correlation and system transfer function determination. A weighted vector adjustment module produces a plurality of complex weighted vector values that are mixed with the plurality of input data streams. Each weighted vector value is incrementally and sequentially adjusted based, in part, on measured undesired power levels. The real and imaginary components of the weighted vector value are updated with an incremented or decremented value that produces the lowest measured undesired power level.

23 Claims, 12 Drawing Sheets

Digital Convertible Radio

Prior Art Cellular Network Cell

Prior Art Analog Hybrid Matrix

Radio Transmitter

Radio Transmitter with Feedback Loop

Digital Convertible Radio

DIGITAL CONVERTIBLE RADIO SNR OPTIMIZATION

CROSS REFERENCE TO RELATED PATENTS

The present application is a continuation in part of a prior filed co-pending application having a title of Digitally Convertible Radio, a Ser. No. of 10/307,624 and a filing date of Dec. 2, 2002 having at least one inventor in common therewith.

BACKGROUND OF THE INVENTION

1. Technical Field of the Invention

This invention relates generally to wireless communication systems and, more particularly, to radio frequency (RF) transmitters used within radio transceivers of such wireless communication systems.

2. Description of Related Art

Communication systems are known to support wireless and wire line communications between wireless and/or wire line communication devices. Such communication systems range from national and/or international cellular telephone systems to the Internet, to point-to-point in-home wireless networks. Each type of communication system is constructed, and hence operates, in accordance with one or more communication standards. For instance, wireless communication systems may operate in accordance with one or more standards, including, but not limited to, advanced mobile phone services (AMPS), digital AMPS, global system for mobile communications (GSM), code division multiple access (CDMA), universal mobile telephone systems (UMTSs), local multi-point distribution systems (LMDSs), multi-channel-multi-point distribution systems (MMDSs), and/or variations thereof, including wireless LAN networks such as IEEE 802.11, Bluetooth, etc.

For direct communications (also known as point-to-point communications), the participating wireless communication devices tune their receivers and transmitters to the same channel or channels (e.g., one of a plurality of radio frequency carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switched telephone network (PSTN), via the Internet, and/or via some other wide area network.

As is known by those of average skill in the art, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

Typically, in a sectored cellular network wherein each cell is divided into three or more cell sectors, each having its own amplification and transmission circuitry, beam forming antennas typically are used to create a forward link transmission pattern that fills the cell sector without overlapping in adjacent cell sectors. While one or two amplifiers could be used in a cell having more than two sectors, it is common to use one amplifier per cell sector. One problem that has been addressed by the prior art is that of amplifier failure in one of the sectors. A pair of N×N hybrid matrices are used in prior art. The first matrix will divide a signal at an input port of the first N×N hybrid matrix into N equal components, with a taper applied to each of the components. The N signals are then applied to N high power amplifiers, whereafter the amplified signals are fed to a second N×N hybrid matrix such that the original signal will only appear at one of the second N×N hybrid matrix output ports. One benefit of using the N×N hybrid matrix for this is that each signal is amplified partially by each of the amplifiers that are operational. Thus, if one amplifier were to fail, all output signals could be amplified sufficiently for transmission through all of the cell sectors (though in a degraded mode of operation). In the hybrid matrix amplifier (prior art), the hybrid matrix is fixed so that the degraded mode of operation impacts the signal-to-noise ratio. Such power sharing further has an advantage in that each forward link amplifier need not be designed to accommodate maximum power loads because additional power may be obtained from one or more other power amplifiers for maximum power requirements (across all the sectors). Thus, lower cost power amplifiers may be utilized.

FIG. 1 is a functional block diagram of a prior art cellular network cell having three cell sectors. More specifically, a cell 02 includes three cell sectors 04. Approximately in the center of cell 02 exists a base station transceiver set (BTS) 06 that includes an amplifier 08 and an antenna 10 for each cell sector 04. FIG. 1 shows the amplifiers 08 and antennas 10 well within its corresponding cell sector 04 to show the relationships therefor. It is understood, however, that the amplifiers 08 and antennas 10 for the cell sectors 04 are located approximately in the center of cell 02. The antennas 10 are so called sector antennas that radiate a pattern to fill cell sectors 04 without overlapping into an adjacent cell sector. For a system as shown in FIG. 1 in which distinct amplifiers are used but in which a hybrid matrix is not included for power sharing, each of the amplifiers 08 must be designed to satisfy maximum power level demands for the sector.

FIG. 2 is a prior art transmitter that includes a pair of analog hybrid matrices. A baseband radio 14 produces a plurality of digital waveform signals to a digital-to-analog conversion module 16 to generate a corresponding plurality of analog signals. The plurality of analog signals are then up-converted by a plurality of mixers 18 that up-convert the plurality of analog signals by multiplying the baseband signals with a local oscillation signal to create output RF signals. The output RF signals are then produced to a first hybrid matrix 20 that produces a corresponding number of transformed signals. More specifically, if the first hybrid matrix 20 receives signals sig_1, sig_2 and sig_3, it produces three transformed analog signals having components of all three signals sig_1, sig_2 and sig_3.

A power amplifier module 22 includes a plurality of power amplifiers that are coupled to receive the $1^{st}$, $2^{nd}$, and $3^{rd}$ transformed analog output signals from the first hybrid matrix 20 and amplifies them. A second hybrid matrix 24 then receives the $1^{st}$, $2^{nd}$, and $3^{rd}$ transformed and amplified signals and recombines them to create amplified versions of sig_1, sig_2, and sig_3 at the second hybrid matrix 24 outputs. In operation, the second hybrid matrix 24 adds the signals at the sum port and cancels out signal portions at the output ports of the second hybrid matrix 24. To effectively cancel unwanted signal components at the output ports, however, the relative component vector (phase and amplitude) and delay must be as expected. If a vector and/or delay error is introduced in or between the first hybrid matrix 20 or the second hybrid matrix 24, then perfect cancellation does not occur at the undesired ports and a resulting waveform continues to include components of other waveforms. Accordingly, it is desirable to substantially cancel the undesired include components of other waveforms thereby optimizing the signal-to-noise ratio at each output port.

While utilizing hybrid matrices are advantageous for the described reasons, including power sharing, hybrid matrices are analog devices that introduce magnitude and phase errors in the output RF signal. Accordingly, what is needed is a system that allows for power sharing to achieve the benefits of an analog hybrid matrix amplifier but that continuously compensates for the introduced magnitude and phase errors.

BRIEF SUMMARY OF THE INVENTION

A plurality of input data streams, having magnitude and phase components, is coupled to a digital convertible radio (DCR) for transmission over a cellular network forward link. The DCR processes, up-converts, and amplifies the input data streams into a plurality of sector signals then steers the plurality of sector signals to selected sector output ports. Each sector signal contains undesired portions of the other input data streams meant for the other sector ports. The method and apparatus of the present invention optimizes the sector signal-to-noise ratio by adjusting the complex weights in the digital hybrid matrix module. The present invention also controls the power at each sector output port by scaling the total power of each input data stream present in the sector signals.

A digital hybrid matrix receives a plurality of input data streams and produces a plurality of mixed input data streams from the plurality of input data streams and a plurality of weighted vector values. Each of the plurality of mixed input data streams includes magnitude and phase components of all the plurality of input data streams. The plurality of mixed input data streams are converted to a plurality of analog mixed signals converted, amplified, and coupled to a plurality of sector signals for transmission on a cellular network forward link. Each of the plurality of sector signal comprises a maximum signal level intended for a selected sector port and minimal levels of all other sector signals.

A correlator module receives the plurality of input data streams and digital representations of the plurality of sector signals. The input data streams are cross-correlated with each other to produce a plurality of input cross-correlated signals. The input data streams are also cross-correlated with the digital representation of the plurality of sector signals to produce a plurality of sector cross-correlated signals. A calculated transfer function is mathematically combined with the plurality of cross-correlated signals to calculate the measurement error resulting from the correlation between input data streams. The measurement error is subtracted from sector signals so the undesired portions of the plurality of input data streams present in the sector signals can be measured accurately. After subtraction of the measurement error, corrected versions of the sector signals results.

A weighted vector adjustment module produces the plurality of weighted vector values, including magnitude and phase components that are coupled to the digital hybrid matrix. Each weighted vector value is adjusted based on received measured power levels of each corrected undesired signal. Responsive to the power level of each corrected undesired signal, the real and imaginary components of each weighted vector value are updated by first subtracting and then adding a convergency constant to each of the weighted vector values. Each real and imaginary part of the weighted vector value is updated with one of the subtracted or added convergency constant based on the updated value that produces the lowest measured corrected undesired power level.

Once all the real and imaginary parts of each one of the plurality weighted vector values have been updated, the updated weighted vector values are scaled to control the forward link power level in the desired sector. The optimization procedure repeats to maintain the optimized signal-to-noise ratio by compensating for slow changes in phase and magnitude introduced by the analog components.

The above-referenced description of the summary of the invention captures some, but not all, of the various aspects of the present invention. The claims are directed to some of the various other embodiments of the subject matter towards which the present invention is directed. In addition, other aspects, advantages and novel features of the invention will become apparent from the following detailed description of the invention when considered in conjunction with the accompanying drawings.

DETAILED DESCRIPTION OF THE INVENTION

These and other features, aspects and advantages of the present invention will be more fully understood when considered with respect to the following detailed description, appended claims and accompanying drawings.

Figure 1:
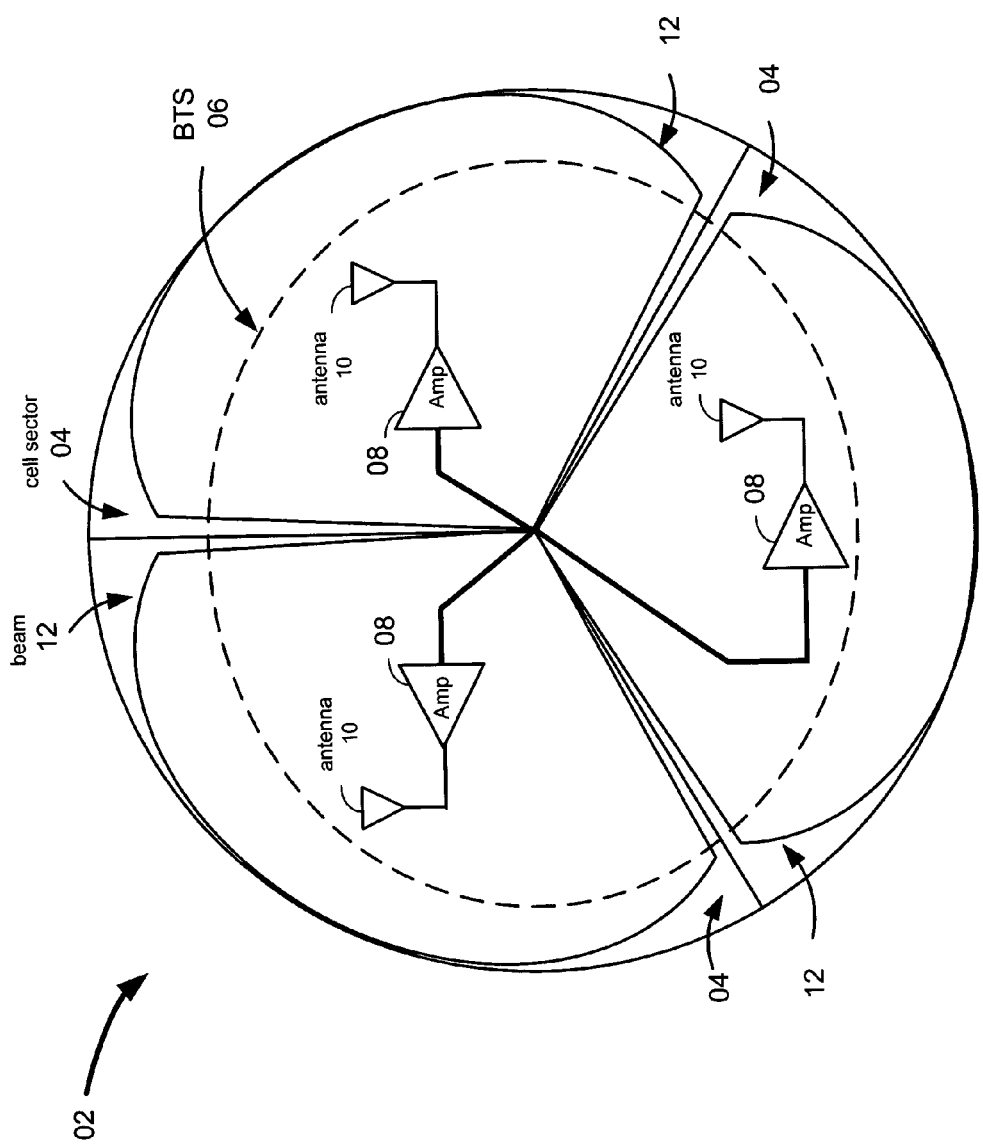
FIG. 1 is a functional block diagram of a prior art cellular network cell having three cell sectors.
Figure 2:
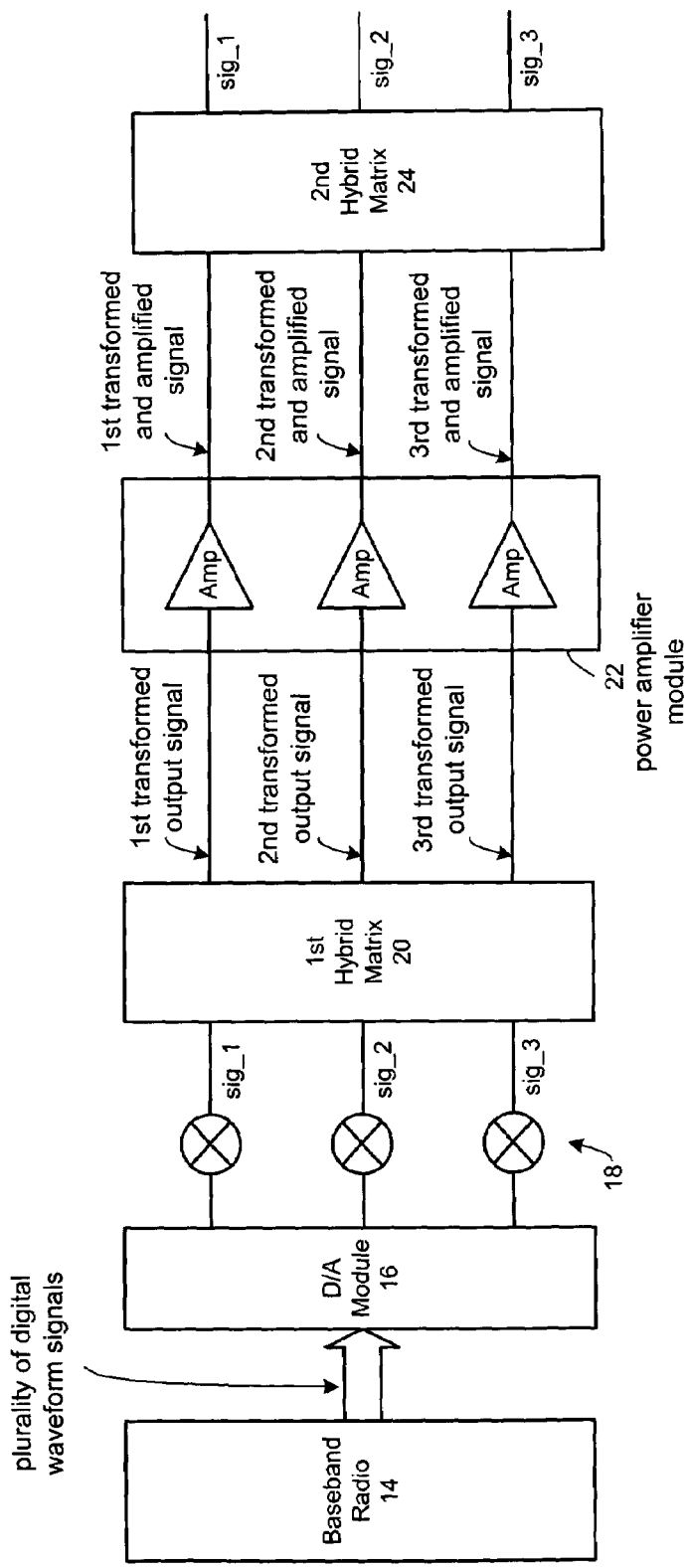
FIG. 2 is a prior art transmitter that includes a pair of analog hybrid matrices.
Figure 3:
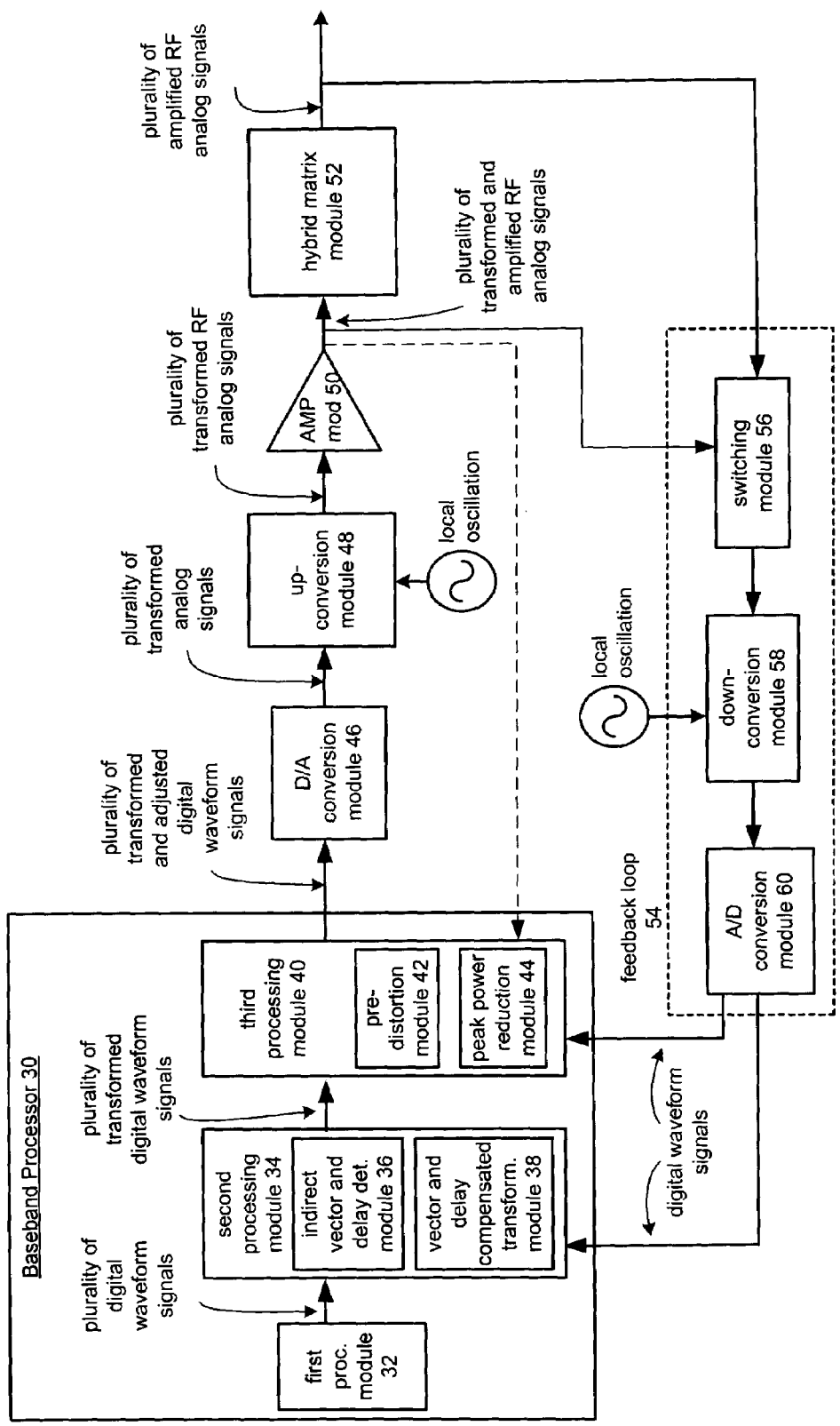
FIG. 3 is a functional block diagram of a radio transmitter formed according to one embodiment of the present invention.

FIG. 3 is a functional block diagram of a radio transmitter formed according to one embodiment of the present invention. A baseband processor 30 includes a plurality of modules that produce a plurality of transformed and adjusted digital waveform signals having compensation components that compensate for errors that are introduced downstream.

More specifically, a first processing module 32 generates a plurality of digital waveform signals, each of which is a digital bit stream that represents an analog radio frequency (RF) signal (i.e., a digital representation of an "analog" RF signal) that is to be transmitted to a cell sector. A second processing module 34 receives the plurality of digital waveform signals and produces a plurality of transformed digital waveform signals wherein each of the plurality of transformed digital waveform signals include digital representations of portions of each of a plurality of RF analog signals represented by the plurality of digital waveform signals produced by the first processing module 32.

The second processing module 34 includes an indirect vector and delay detection module 36 and a vector and delay compensated transformation module 38. The indirect vector and delay detection module 36 uses the amplitude of the signals at the output ports to determine the degree of summation and cancellation. Based on the degree of summation and cancellation, the vector and delay compensated transformation module 38 is formed to introduce either one or both of a vector and delay component to the plurality of digital waveform signals by adjusting the vector and delay compensated transformation module 38. A plurality of transformed digital waveform signals produced by the second processing module 34 of the baseband processor 30 is thus modified in amplitude, phase and delay according to detected vector and delay errors introduced downstream. A third baseband processor 40 then applies a number of further processing functions to each of the plurality of transformed digital waveform signals at the output of the second processing module 34. The functions include baseband pre-distortion, peak power reduction and a number of filter functions. The baseband processor 30 and, more specifically, the third processing module 40, then produces the plurality of transformed and adjusted digital. waveform signals to a digital-to-analog conversion module 46 wherein the plurality of transformed and adjusted digital waveform signals are converted from a digital domain to an analog domain to create a plurality of transformed analog signals. The converted plurality of transformed analog signals are then produced by the digital-to-analog conversion module 46 to an up-conversion module 48 where they are up-converted from a baseband frequency to a radio frequency (RF) to create a plurality of transformed RF analog signals.

The plurality of transformed RF analog signals is then produced from the up-conversion module 48 to a power amplification module 50 wherein the plurality of transformed RF analog signals is amplified to create a plurality of transformed and amplified RF analog signals. The plurality of transformed and amplified RF analog signals is then produced by the power amplification module 50 to a hybrid matrix module 52.

The hybrid matrix module 52 receives the plurality of transformed and amplified RF analog signals and produces a plurality of amplified RF analog signals to the appropriate sum and cancellation ports for transmission into an appropriate cell sector. Additionally, the plurality of amplified RF analog signals is also coupled to a feedback loop 54. The feedback loop 54 includes a switching module 56 coupled to receive and select between each of the plurality of transformed and amplified RF analog signals before the hybrid matrix module 52 and the plurality of amplified RF analog signals after the hybrid matrix module 52. The selected output of the switching module 56 is then produced to a down-conversion module 58 where it converts the selected amplified RF analog signal to a baseband or intermediate frequency. The down-converted signal is then produced to an analog-to-digital conversion module 60 that converts the signal to the digital domain. The digitally converted signals are produced by the analog-to-digital conversion module 60 to the third processing module 40, and more specifically, to a peak power reduction module 44 and to a pre-distortion module 42. Pre-distortion module 42 and peak power detection module 44 are operable to compensate for distortion and reduce peak power for a given digital waveform signal, respectively. The digitally converted signals are also produced to the indirect vector and delay detection module 36 of the second processing module 34.

The indirect vector and delay detection module 36 of the second processing module 34 then determines the degree of error of the sum and cancellation ports relative to desired values. The vector and delay compensated transformation module 38 of the second processing module 34 compensates and adjusts the amplitude, phase and delay of the corresponding components of the plurality of digital waveform signals produced by the first processing module 32, based on the errors determined by the indirect vector and delay detection module 36, by adjusting the vector and delay compensated transformation module 38 to compensate for the errors introduced downstream from the baseband processor 30.

For example, if the digital signal represents a first amplified RF analog signal, and the vector and delay compensated transformation module 38 determines that the first amplified RF analog signal from the hybrid matrix module 46 has a component that is lagging by 10 degrees due to introduced phase errors, then the vector and delay compensated transformation module 38 advances the corresponding component in the corresponding transformed and adjusted digital waveform signal by 10 degrees.

In this example, the phase shift of the component of the first amplified RF analog signal has been compensated by adding 10 degrees to the corresponding transformed and adjusted digital waveform signal. Similar compensation may also be made for the other signal components as necessary. For example, the indirect vector and delay detection module 36 is operable to detect vector (phase and amplitude) and delay errors and to compensate therefor.

Figure 4:
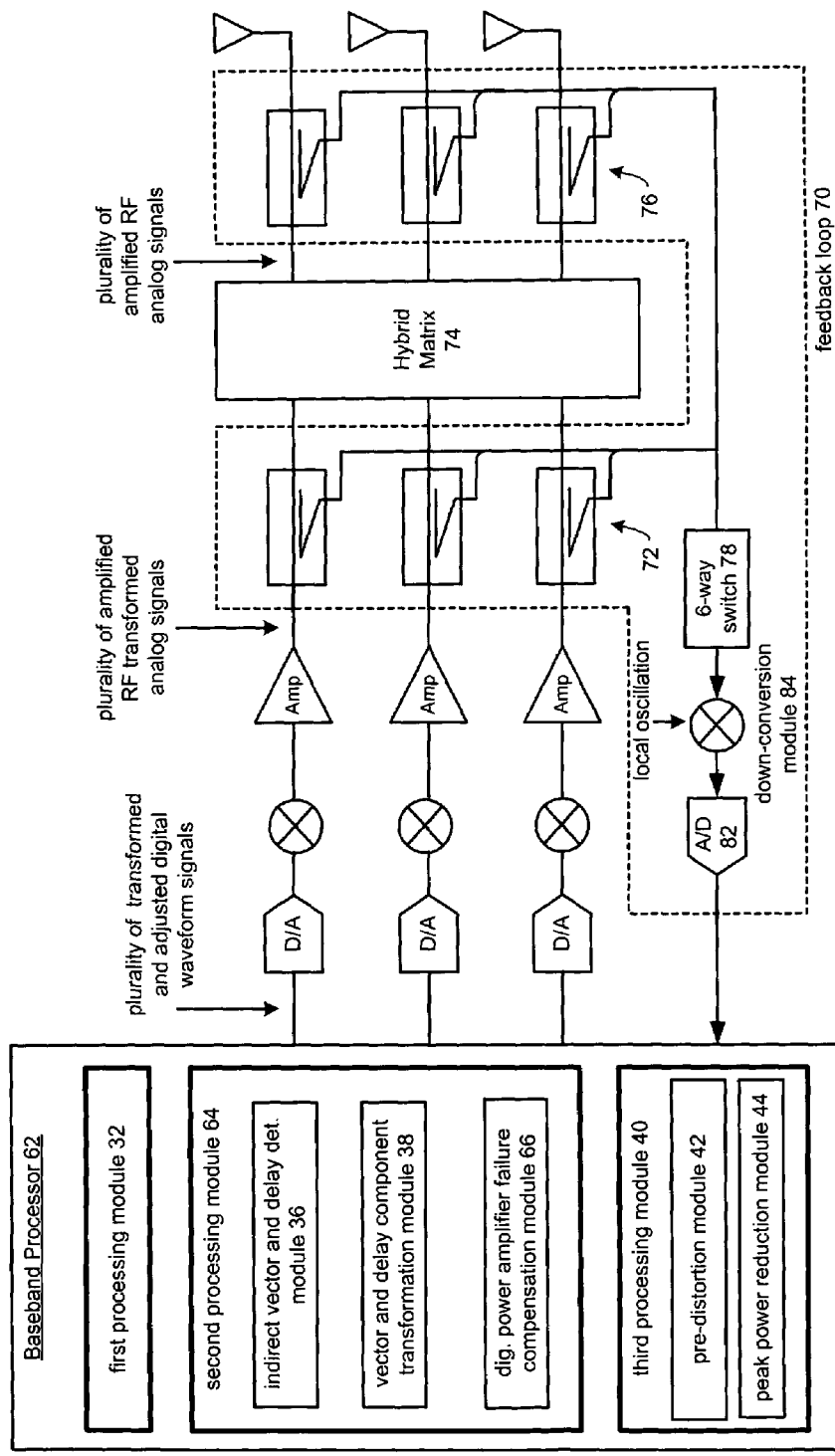
FIG. 4 is a functional block diagram of a radio transmitter illustrating one aspect of the present invention.

FIG. 4 is a functional block diagram of a radio transmitter illustrating one aspect of the present invention. A baseband processor 62 includes a first processing module 32, a second processing module 64 and a third processing module 40. First and third processing modules 32 and 40 are as described in FIG. 3. Second processing module 64, however, further includes a digital power amplifier failure compensation module 66.

The digital power amplifier failure compensation module 66 is, among other functions, for defining how the configuration of the vector and delay compensated transformation module 38 will change to compensate for a condition where one of the paths between the baseband processor 62 and a hybrid matrix 74 has failed, giving the best possible system performance under the given failure condition.

Statistically, all three sectors will not be fully loaded and since power is shared between all the amplifiers, the amplifier size can be reduced while still achieving the required total power across all sectors. Without power sharing, the amplifier power has to be high enough to handle the fully loaded sector. But, if the sector is under-loaded, the portion of the amplifier power is under-utilized. Thus, power sharing allows the individual amplifier sizes to be reduced. The power sharing capability is a result of the transformation process.

Many of the components of FIG. 3 are shown in FIG. 4. Accordingly, those components will not be described further here in the description of FIG. 4. FIG. 4 further illustrates a feedback loop 70 that includes a plurality of directional couplers 72 that are connected between the power amplifiers for each branch and hybrid matrix 74, and a plurality of directional couplers 76 that are connected between hybrid matrix 74 and antennas through which RF is propagated. The feedback loop 70 further includes a six-way switch 78. In the example of FIG. 4, the six directional couplers 72 and 76 are coupled to the six-way switch 78 (or, alternatively, a multiplexer) that selects one of the six inputs provided by the six directional couplers 72 and 76 and produces the selected input to a down-conversion module 84.

The down-conversion module 84 then produces a baseband or intermediate frequency signal to an analog-to-digital converter 82 for converting the signal to the digital domain for processing and analysis by the baseband processor 62. The six directional couplers 72 and 76, the six-way switch 78, the down-conversion module 84 and the analog-to-digital converter 82 all are shown here in FIG. 4 as being part of the feedback loop 70. The feedback loop 70 produces the selected signal to the baseband processor 62 and, more particularly, to the second processing module 64 and third processing module 40 (and the modules included therein) for analysis as described herein and for phase, amplitude and delay of the corresponding signals responsive thereto.

Figure 5:
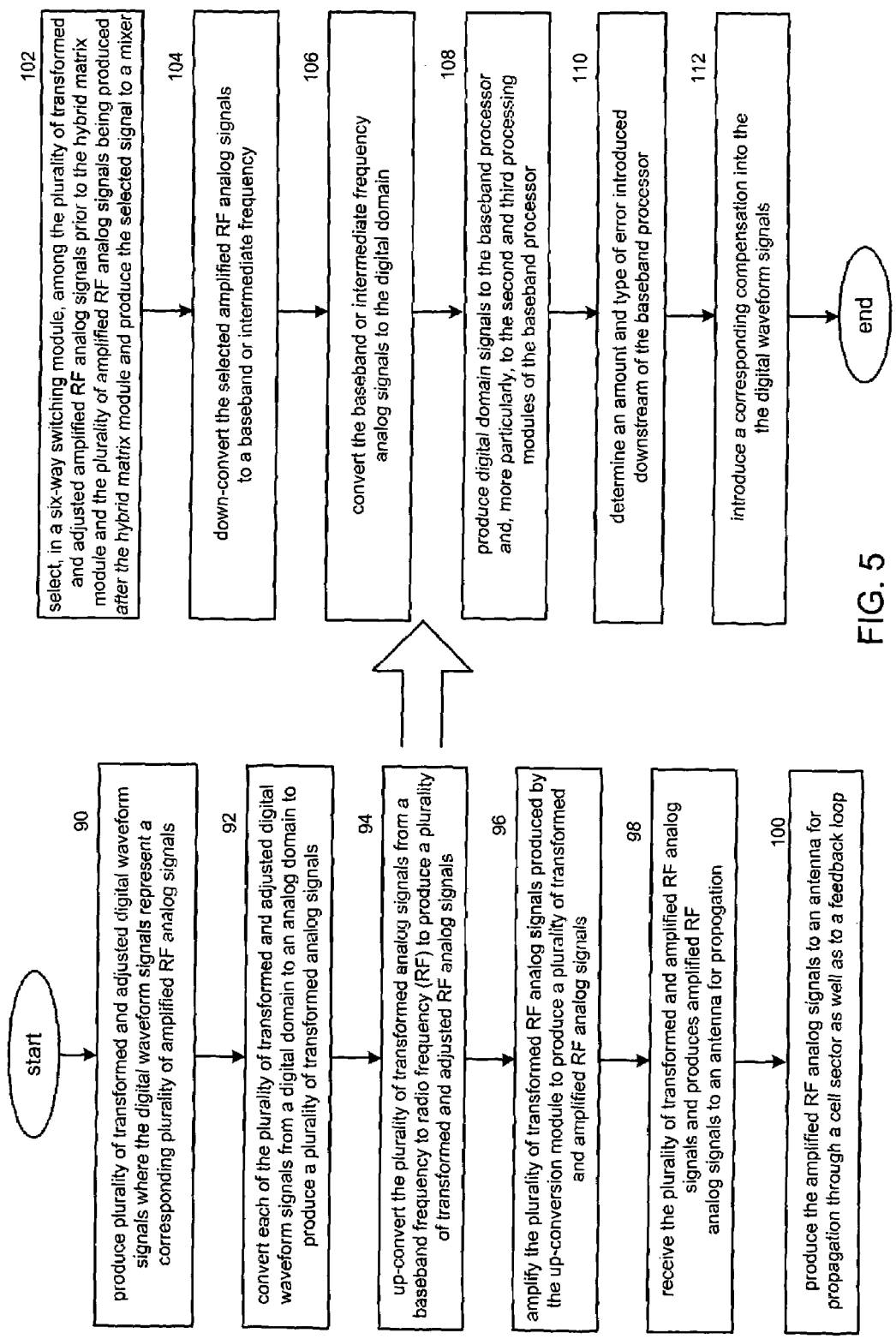
FIG. 5 is a flow chart illustrating a method for generating forward link communication signals according to an embodiment of the invention.

FIG. 5 is a flowchart illustrating a method by a base station for generating forward link communication signals according to an embodiment of the invention. Initially, a baseband processor produces a plurality of transformed and adjusted digital waveform signals where the digital waveform signals represent a corresponding plurality of amplified RF analog signals (step 90). In general, the radio transmitter transmits an amplified RF analog signal to mobile terminals within a cell or cell sector. Because the baseband processor operates in the digital domain, however, it generates a plurality of transformed and adjusted digital waveform signals where the digital waveform signals represent a corresponding plurality of amplified RF analog signals that are to be transmitted from antennas within the corresponding cell sectors.

Thereafter, a digital-to-analog conversion module in the radio transmitter converts each of the plurality of transformed and adjusted digital waveform signals from a digital domain to an analog domain to produce a plurality of transformed analog signals (step 92). The transformed analog signals are then up-converted from a baseband frequency to radio frequency (RF) to produce a plurality of transformed RF analog signals (step 94). The radio transmitter then amplifies the plurality of transformed RF analog signals produced by the up-conversion module to produce a plurality of transformed amplified RF analog signals (step 96).

The hybrid matrix module is coupled to receive the plurality of transformed amplified RF analog signals and produces amplified RF analog signals to an antenna for propagation (step 98). Each of the amplified RF analog signals only includes components for the amplified RF analog signal for transmission into a specific cell sector. The transmitter produces the amplified RF analog signals to an antenna for propagation through a cell sector as well as to a feedback loop (step 100). In addition to propagating the amplified RF analog signals, the feedback loop(s) need to be utilized to provide the baseband processor the ability to determine what downstream error has been introduced to facilitate compensation therefore. Accordingly, the invention includes selecting, in a six-way switching module in one embodiment of the invention, among the plurality of transformed and amplified RF analog signals prior to the hybrid matrix module and the plurality of amplified RF analog signals being produced after the hybrid matrix module and produce the selected signal to a mixer for down-conversion from RF to baseband or an intermediate frequency (step 102).

Thereafter, the amplified RF analog signals are converted to a baseband or intermediate frequency in the described embodiment of the invention (step 104). The method then includes conversion of the baseband or intermediate frequency analog signals to the digital domain (step 106). The digital domain signals are then produced to the baseband processor and, more particularly, to the second and third processing modules of the baseband processor (step 108). The baseband processor or, more particularly, the second processing module of the baseband processor, then determines an amount and type of error introduced downstream of the baseband processor (step 110). Finally, the invention includes introducing a corresponding compensation into the digital waveform signals to compensate for the determined error introduced downstream from the baseband processor (step 112).

Figure 6:
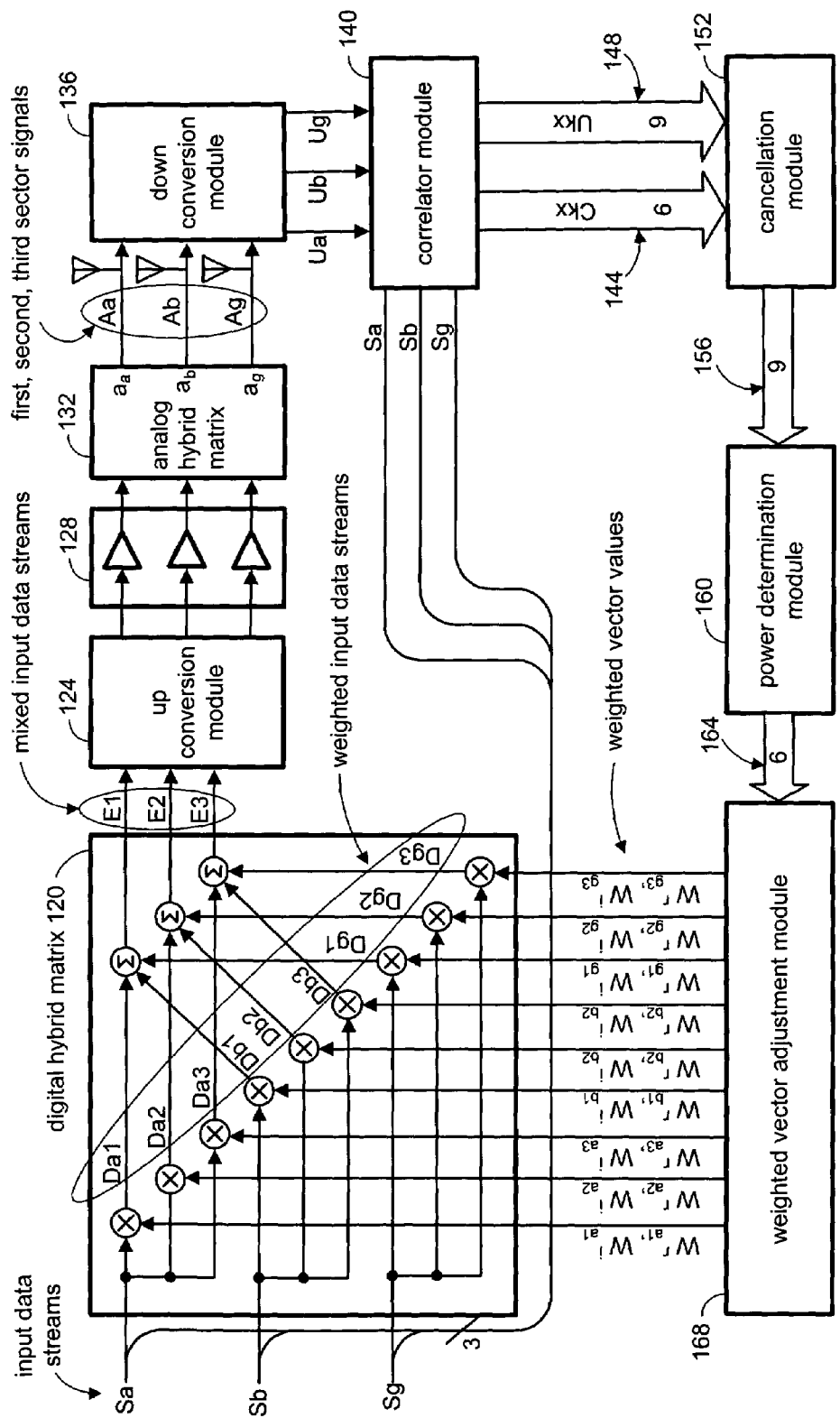
FIG. 6 is a schematic block diagram of a digital convertible radio (DCR) formed to optimize signal-to-noise ratio according to one embodiment of the present invention.

FIG. 6 is a schematic block diagram of a digital convertible radio (DCR) formed to optimize signal-to-noise ratio according to one embodiment of the present invention. Although the DCR illustrated in FIG. 6 is formed for three input data streams and three sectors to simplify discussion, it should be understood by one of average skill in the art that the present invention is envisioned as an N×N system.

A digital hybrid matrix 120 receives input data streams Sa, Sb, and Sg, comprising digital data bit streams destined for three sectors in a cellular network or three beams in a single sector of a multi-beam system. The DCR optimizes the signal-to-noise ratio at each sector by minimizing the undesired power contributed by the components of the other sectors. This is accomplished by combining, in the DHM, weighted vector values having phase and magnitude components with each input data stream to produce mixed input data streams that substantially cancel the undesired components. Each of the input signals, $S_a$, $S_b$ and $S_g$, are multiplied by three complex weighted vector values received from the weighted vector adjustment module. Each of the weighted vector values in turn consists of the real and imaginary parts $w_k^r$ and $w_k^i$, respectively, where k∈{a,b,g}. The result after multiplication is nine signal streams $D_{k1}$, $D_{k2}$ and $D_{k3}$. The signals are then added together to produce three mixed input data streams $E_1$, $E_2$ and $E_3$ as follows:

$$E_i = D_{ai} + D_{bi} + D_{gi}$$

where i∈{1,2,3}. These mixed input data streams now contain portions of all three input data streams. The mixed input streams produce by the DHM are coupled to up-conversion module 124 where the mixed input data streams are digitally processed, converted from the digital domain to the analog domain (A/D) and up-converted from baseband frequency to RF communication frequencies. The analog RF mixed signals are then coupled to amplifier module 128 for amplification prior to transmission. Analog hybrid matrix 132 receives the amplified analog mixed RF signals and transform them to sector signals, Aa, Ab, and Ag, for transmission on coupled sector antennas.

All of the downstream components, namely the AHM, A/D, up-conversion, and amplification generate phase and amplitude errors that change over time due to temperature, and other factors. In order to maximize the desired signal in a specific sector, the weighted vector values are adjusted to correct for the generated phase and amplitude errors as well as minimize the undesired signals at that sector.

The sector signals Aa, Ab, and Ag are sampled by down-conversion module 136, converted from the analog domain to the digital domain (D/A), and down-converted to baseband. Each signal, Ua, Ub, Ug, are scaled representation of sector signals, Aa, Ab, and Ag, and prior to optimization, contain portions of all three input data streams. The method and apparatus of the present invention seeks to maximize the desired signal power at the appropriate port while minimizing the undesired signals at the same ports. In other words, input data stream signal Sa will be maximized at AHM port $a_a$ while the portions of input data streams Sb and Sg present at AHM port $a_a$ will be minimized. Similarly, input data streams Sb and Sg will be maximized at AHM ports $a_b$ and $a_g$, respectively. After optimization, the signal-to-noise ratio at all three sector output ports will be maximized by minimizing the undesired portions (noise) of the sector signals. For example, let $S_a^a$ represent the portion of input data stream Sa present at port $a_a$, then the undesired portions of input data streams Sb and Sg present at port $a_a$, signals $S_b^a$ and $S_g^a$, are noise.

The input data streams and converted sector signals are coupled to correlator module 140 which produces a plurality of cross-correlated signals. Cross-correlation is defined as the summation of the product of a signal $Y_k$ and the complex conjugate (formed by changing the sign of the imaginary part of a complex number) of a signal $Z_x$ over N time samples and normalized to N, where $x \in \{a,b,g\}$:

$$C_{kx} = \frac{1}{N} \sum_{n=1}^{N} Y_k(n)[Z_x(n)]^*,$$

where [ ]* is the complex conjugate of $Z_x(n)$.

Correlator module 140 produces a plurality of sector cross-correlated signals and input cross-correlated signals. Each input data stream is cross-correlated with the other two input data streams to produce six input cross-correlated signals, $C_{kx}$ identified as signal 144, where $C_{kx}$ is the cross-correlation of input data stream $S_k$ with input data stream $S_x$. For example, $C_{ag}$ is the cross-correlation between the input data stream $S_a$ and input data stream $S_g$. Each converted sector signal, namely $U_a$, $U_b$, and $U_g$, is cross-correlated with each input data stream to produce nine sector cross-correlated signals, $U_{kx}$, identified as signal 148. For example $U_{ag}$ is the cross correlation between converted sector signal $U_a$ and input data stream $S_g$.

If the input data streams ($S_a$, $S_b$ and $S_g$) are completely uncorrelated over the summation time N, $U_{kx}$ will contain only the components of the signal $S_x$ at port $a_k$. However, typical input data streams will have some form of correlation (partial correlation) between them over a realistic sample size N, so it is necessary to correct the sector cross-correlated signals by substantially canceling the partial correlated portions of the input signals from $U_{kx}$.

The plurality of cross-correlated signals are coupled to cancellation module 152 which combines the plurality of cross-correlated signals to substantially cancel the partial correlation between the input data streams and to produce therefrom a plurality of corrected sector cross-correlated signals. The cross-correlation of the input data streams indicates how much undesired signal there is to cancel in the cross-correlation of the input data streams with the converted sector signals, i.e. $U_{kx}$. Cancellation module 152 substantially cancels, from a single sector cross-correlated signal, the undesired correlated components of all other sector cross-correlated signals, $C_{kx}$.

The cancellation module 152 algorithm calculates the transfer function between the three input data streams, $S_{kx}$, and the converted sector signals $U_a$, $U_b$, $U_g$, which are digital domain representations of the three sector signals Aa, Ab, Ag. The transfer function between input ports and converted output ports is:

$$T = \begin{bmatrix} T_{aa} & T_{ab} & T_{ag} \\ T_{ba} & T_{bb} & T_{bg} \\ T_{ga} & T_{gb} & T_{gg} \end{bmatrix}$$

where $T_{kx}$ is the transfer function between output port k and input port x, including the weighted vector values. The converted sector signals $U_a$, $U_b$ and $U_g$ are then:

$$\begin{bmatrix} U_a \\ U_b \\ U_g \end{bmatrix} = \begin{bmatrix} T_{aa} & T_{ab} & T_{ag} \\ T_{ba} & T_{bb} & T_{bg} \\ T_{ga} & T_{gb} & T_{gg} \end{bmatrix} \begin{bmatrix} S_a \\ S_b \\ S_g \end{bmatrix}$$

Using the above equations, the converted sector signals $U_a$, $U_b$ and $U_g$ are:

$$U_a = T_{aa}S_a + T_{ab}S_b + T_{ag}S_g$$

$$U_b = T_{ba}S_a + T_{bb}S_b + T_{bg}S_g$$

$$U_g = T_{ga}S_a + T_{gb}S_b + T_{gg}S_g$$

The optimization algorithm needs an accurate measurement of the portion of each input data stream appearing at each output of down-conversion module 136, namely $U_a$, $U_b$ and $U_g$. In order to measure the portion of $S_b$ that is present in $U_a$, for example, $U_a$ is cross-correlated with $S_b$. The cross-correlation can be written as:

$$U_{ab} = \frac{1}{N} \sum_{n=1}^{N} U_a(n)[S_b(n)]^*$$

or:

$$U_{ab} = \frac{1}{N} \sum_{n=1}^{N} \{T_{aa}(n)S_a(n)[S_b(n)]^*\} + \frac{1}{N} \sum_{n=1}^{N} \{T_{ab}(n)S_b(n)[S_b(n)]^*\} + \frac{1}{N} \sum_{n=1}^{N} \{T_{ag}(n)S_g(n)[S_b(n)]^*\}$$

Assuming that T is static over the N samples, the above equation becomes:

$$U_{ab} = T_{aa} \frac{1}{N} \sum_{n=1}^{N} \{S_a(n)[S_b(n)]^*\} + T_{ab} \frac{1}{N} \sum_{n=1}^{N} \{S_b(n)[S_b(n)]^*\} + T_{ag} \frac{1}{N} \sum_{n=1}^{N} \{S_g(n)[S_b(n)]^*\}$$

which is simply:

$$U_{ab}=T_{aa}C_{ab}+T_{ab}C_{bb}+T_{ag}C_{gb}$$

where $C_{bb}$ is the auto-correlation of $S_b$, $C_{ab}$ is the cross-correlation of $S_a$ and $S_b$, and $C_{gb}$ is the cross-correlation between $S_g$ and $S_b$. The algorithm measures $U_{ab}$ and seeks to minimize it. In the case where there is correlation between the input signals, $C_{ab}$ and $C_{gb}$ will be non-zero and the terms $T_{aa}C_{ab}$ and $T_{ag}C_{gb}$ will disturb the measurement of $U_{ab}$. However, the signals $S_a$, $S_b$ and $S_g$ are known and therefore the cross correlation between signals $C_{ab}$ and $C_{gb}$ can be accurately calculated.

Similar to the above calculations, the cross-correlations of signals $U_{ka}$, $U_{kb}$ and $U_{kg}$ are:

$$U_{ka}=T_{ka}C_{aa}+T_{kb}C_{ba}+T_{kg}C_{ga}$$

$$U_{kb}=T_{ka}C_{ab}+T_{kb}C_{bb}+T_{kg}C_{gb}$$

$$U_{kg}=T_{ka}C_{ag}+T_{kb}C_{bg}+T_{kg}C_{gg}$$

Using techniques known to one of average skill in the art, the transfer function for components $T_{ka}$, $T_{kb}$ and $T_{kg}$ can be determined from the equations above:

$$\begin{bmatrix} T_{ka} \\ T_{kb} \\ T_{kg} \end{bmatrix} = \begin{bmatrix} C_{aa} & C_{ab}^* & C_{ag}^* \\ C_{ab} & C_{bb} & C_{bg}^* \\ C_{ag} & C_{bg} & C_{gg} \end{bmatrix}^{-1} \begin{bmatrix} U_{ka} \\ U_{kb} \\ U_{kg} \end{bmatrix}$$

Once the transfer function and cross-correlation between input data streams have been calculated, the measurement error resulting from the correlation between input data streams can be cancelled. In the case of $U_{ab}$, the cancellation is done by subtracting the measurement error part $T_{aa}C_{ab}+T_{ag}C_{gb}$ from $U_{ab}$, or $$U_{ab}^c=U_{ab}-T_{aa}C_{ab}-T_{ag}C_{gb}$$

with $U_{ab}^c$ denoting the corrected signal. Similarly, the following components have to be subtracted from the digital domain representation of the sector signals in order to correct for the measurement error:

Port a $$U_{aa}^c=U_{aa}-T_{ab}C_{ba}-T_{ag}C_{ga}$$

$$U_{ab}^c=U_{ab}-T_{aa}C_{ab}-T_{ag}C_{gb}$$

$$U_{ag}^c=U_{ag}-T_{aa}C_{ag}-T_{ab}C_{bg}$$

Port b $$U_{ba}^c=U_{ba}-T_{bb}C_{ba}-T_{bg}C_{ga}$$

$$U_{bb}^c=U_{bb}-T_{ba}C_{ab}-T_{bg}C_{gb}$$

$$U_{bg}^c=U_{bg}-T_{ba}C_{ag}-T_{bb}C_{bg}$$

Port g $$U_{ga}^c=U_{ga}-T_{gb}C_{ba}-T_{gg}C_{ga}$$

$$U_{gb}^c=U_{gb}-T_{ga}C_{ab}-T_{gg}C_{gb}$$

$$U_{gg}^c=U_{gg}-T_{ga}C_{ag}-T_{gb}C_{bg}$$

Once the measurement errors have been substantially removed by the cancellation module 152, the nine corrected signals shown above, illustrated by signal 156, are coupled to power determination module 160 which will calculate the portion of the power of each input data stream that is present at each of the sector ports. The power for each of the corrected signals is calculated by multiplying the corrected signal by its complex conjugate:

$$P_{kx}=U_{kx}^c(U_{kx}^c)^*$$

The effect of input signal average power variation over sample time N is removed by normalizing the measured sector power to the input signal power or:

$$p_{kx}^n = \frac{U_{kx}^c(U_{kx}^c)^*}{C_{xx}}$$

where $C_{xx}$ is the auto-correlation of signal $S_x$, which is actually the average power in the signal over the interval of N samples. The optimization algorithm will minimize the sum of the power of the undesired signals at each port. The undesired power for signals $S_a$, $S_b$ and $S_g$ is:

$$P_{ua}^n=P_{ba}^n+P_{ga}^n$$

$$P_{ub}^n=P_{ab}^n+P_{gb}^n$$

$$P_{ug}^n=P_{ag}^n+P_{bg}^n$$

The correlation/cancellation steps ensure that the measured undesired power of the different input data streams appearing at the sector ports are isolated from each other. For example, modifying any of the weighted vector values for input data stream $S_a$, will only affect the portion of the measured power of signal $S_a$ appearing at port $a_a$, or $P_{ua}^n$. In addition $P_{ua}^n$ is not affected by the other input data streams present at the other ports where $P_{ua}^n$ is measured thus each of the weighed vector values can be updated simultaneously.

The normalized corrected undesired power measurements, indicated by signal 164, are coupled to weighted vector adjustment module 168 which will adjust each weighted vector value to minimize the undesired power present at each sector output port. Each input data stream, Sa, Sb, and Sg, are mixed with three weighted vector values comprising real and imaginary parts. The real part of the first weighted vector value for input data stream Sa is shown as $W_{a1}^r$. Similarly, the imaginary part of the third weighted vector value for input data stream Sg is shown as $W_{g3}^i$.

Weighted vector adjustment module 168 weight optimization method will iteratively and sequentially adjust each weighted vector value (3 real and 3 imaginary) such that the undesired power measurements will converge to a minimum value. The weighted vector value adjustment procedure is conducted in parallel for all three input data streams starting with the real part of the first weighted vector value of each input data stream $S_x$ ($w_{x1}^r$). For example, the first real part of the weighted vector value for input data stream Sa is updated based on the following $$(w_{a1}^r)^{new}=w_{a1}^r+\beta\mu$$

where $(w_{a1}^r)^{new}$ is the new or updated weighted vector value, $\beta$ is either 0, 1 or −1 depending on the measured undesired power and $\mu$ is the convergency constant.

The value of $\beta$ is determined as follows:

$\beta=-1$ and the weight updated if the following condition is valid:

$$(P_{ua}(w_{a1}^r-\mu, w_{a1}^i, \ldots, w_{a3}^i)\xi<P_{ua}(w_{a1}^r, w_{a1}^i, \ldots, w_{a3}^i))$$

where:

$$\xi = \frac{|w_{a1}^r|^2 + |w_{a1}^i|^2 + \ldots + |w_{a3}^i|^2}{|w_{a1}^r + \beta\mu|^2 + |w_{a1}^i|^2 + \ldots + |w_{a3}^i|^2}$$

In this case ξ ensures that the observed change in the undesired power is not just due to the fact that the weighted vector value is reduced in amplitude by the subtraction of the convergency constant. Without this factor, the weighted vector values will not converge under certain initial weight conditions.

If the above condition is not valid, then the following is checked and the weight updated if condition is true:

β=1 if:

$$(P_{ua}(w_{a1}^r+\mu, w_{a1}^i, \ldots, w_{a3}^i)\xi < P_{ua}(w_{a1}^r w_{a1}^i, \ldots, w_{a3}^i))$$

In this case ξ ensures that the observed change in the undesired power is not just due to the fact that the weighted vector value is increased in amplitude by the addition of the convergency constant. Without this factor, the weighted vector values will not converge under certain initial weight conditions.

β=0 if neither of the above conditions are valid.

The convergency constant is chosen so that the optimization procedure converges to and stays near the minimum value. In one embodiment, the convergency constant is a fixed value while in an alternate embodiment, the convergency constant changes as undesired power measurements decrease. For example, the convergency constant can be selected to have one value at the start of the optimization then transition to a second smaller value as the optimization nears the minimum.

The optimization procedure begins by measuring a first undesired power level with all the other weighted vector values held constant. The convergency constant is subtracted from the first weight $w_{a1}^r$ and a second undesired power level is measured. If the second undesired power level is less than the first undesired power level, the weight will be updated with the subtracted weight vector value, or $(w_{a1}^r)^{new} = w_{a1}^r - \mu$. If the second undesired power level is not less than the first undesired power level, the convergency constant is added to the original weight $w_{a1}^r$ and a third undesired power level is measured. If the third undesired power level is smaller than the first undesired power level, then the original weighted vector value will be updated by adding convergency constant to the weight, or $(w_{a1}^r)^{new} = w_{a1}^r + \mu$. If neither of the two conditions is valid, the weighted vector value is left unchanged. The real component of the first weighted vector value has been updated. The procedure repeats for each of the remaining two real and three imaginary weighted vector values of input data stream $S_a$. After the first iteration, all of the weighted vector values for input data streams $S_a$, $S_b$, and $S_g$ are updated.

In order to control the power at the desired port, all of the weighted vector values will be scaled. This is done by measuring the power at all the output ports for signal $S_a$, or:

$$P_{ta}^n = P_{aa}^n + P_{ba}^n + P_{ga}^n$$

If the total normalized power is less than a target value of one, all six weight values will be multiplied by a gain scaling factor that is larger than but close to one, i.e. 1.1. In the case where the total normalized power is larger than one, all the weights will be multiplied by the inverse of the gain scaling factor. The larger this value, the faster the total signal will reach the target value. The amount of scaling can also be changed based on the difference between the total measured power and the target power. If the total power is close to one, a smaller scaling factor is used.

Once all the weights have been scaled, the second iteration will commence by sequentially updating the six individual weighted vector values based on the measured undesired power as described above. All weighted vector values will then be scaled again, depending on the total power level. The procedure repeats until the undesired power reaches a desired threshold.

The DCR is considered optimized when the desired signal-to-noise ratio has been reached. The procedure repeats to keep the DCR optimized so that slow changes in the phase and amplitude in the analog components and the analog hybrid matrix will be corrected for by the algorithm.

Figure 7:
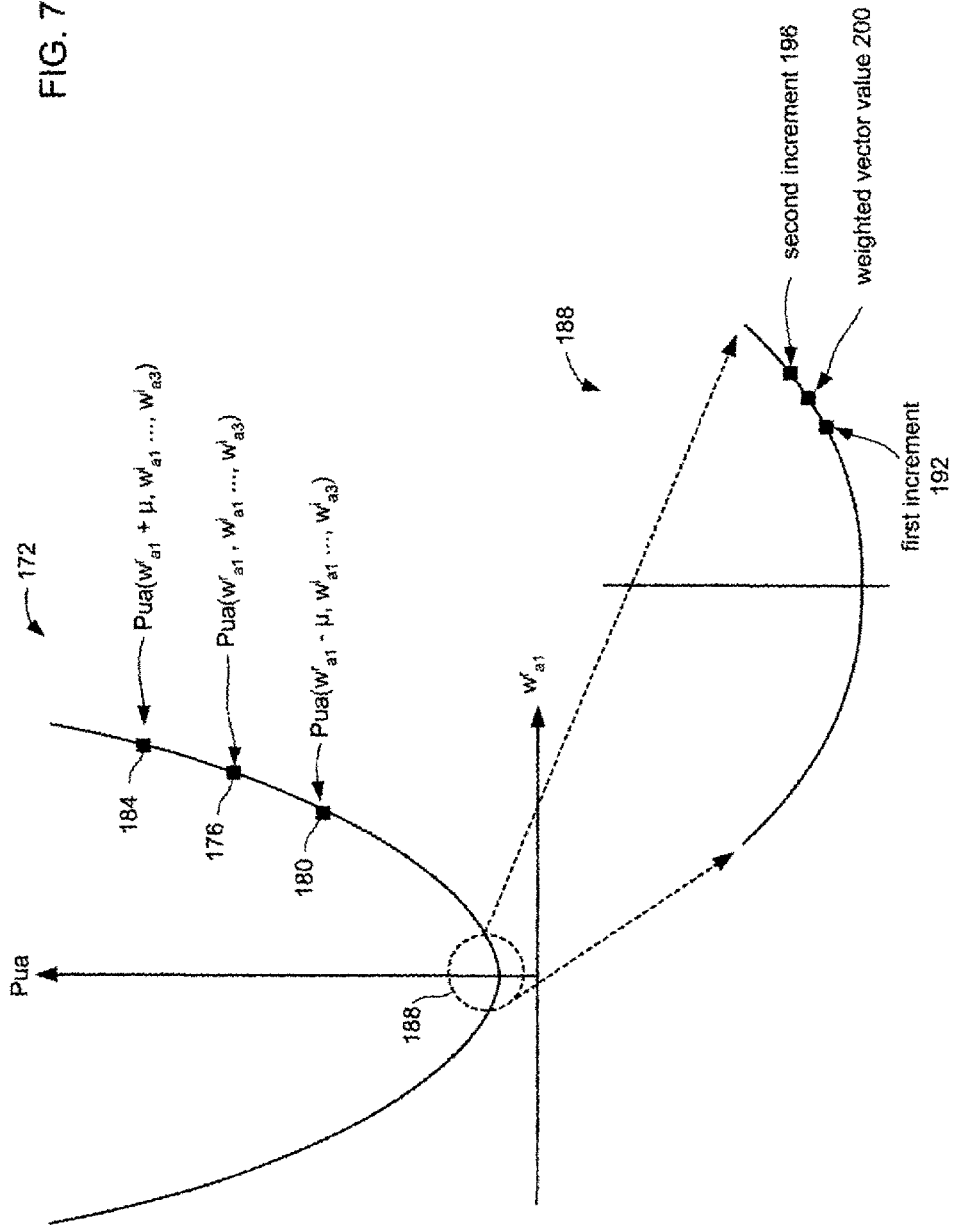
FIG. 7 is a graph illustrating the optimization procedure according to one embodiment of the present invention.

FIG. 7 is a graph illustrating the optimization procedure according to one embodiment of the present invention. The optimization for input data stream $S_a$ is illustrated in FIG. 7, but it is understood by one of average skill in the art that optimization of input data streams $S_b$ and $S_g$ is performed simultaneously. The power measurements for the real part of the first weighted vector value for signal $S_a$ is shown generally at 172. As described previously, power measurement 176 is made with the other weighted vector values held constant. The weighted vector value $W_{a1}^r$, is adjusted by subtracting the convergency constant μ, then measuring undesired power $P_{ua}$ 180. If power measurement $P_{ua}$ 180 is less than power measurement 176, the weighted vector value is update with the new value of $W_{a1}^r - \mu$ and the sequence continues with imaginary part $W_{a1}^i$. If, however, power measurement $P_{ua}$ 180 is more than power measurement 176, the convergency constant is added to $W_{a1}^r$ and power measurement $P_{ua}$ 184 is made. Weighted vector value $W_{a1}^r$ is updated if $P_{ua}$ 184 is less than $P_{ua}$ 176 otherwise the weighted vector value $W_{a1}^r$ is left unchanged. The procedure is repeated for all real and imaginary values for all weighted vector values.

As the optimization procedure reaches a defined undesired power measurement threshold, the algorithm, in one embodiment, uses a smaller convergency constant value in order to reach a desired optimization. This is illustrated by detail 188. A first increment 192 and a second increment 196 generally have smaller magnitudes than the increments shown generally at 172. In an alternate embodiment, first increment 192 and second increment 196 are assigned different magnitudes First increment 192 and second increment 196 are subtracted and added, respectively, from weighted vector value 200 as previously described. The use of a smaller convergency constant allows for more precise control of the weighted vector values near the minimum undesired power point. The signal-to-noise ratio is considered optimized when the undesired power (the noise) is at or near a minimum.

Figure 8:
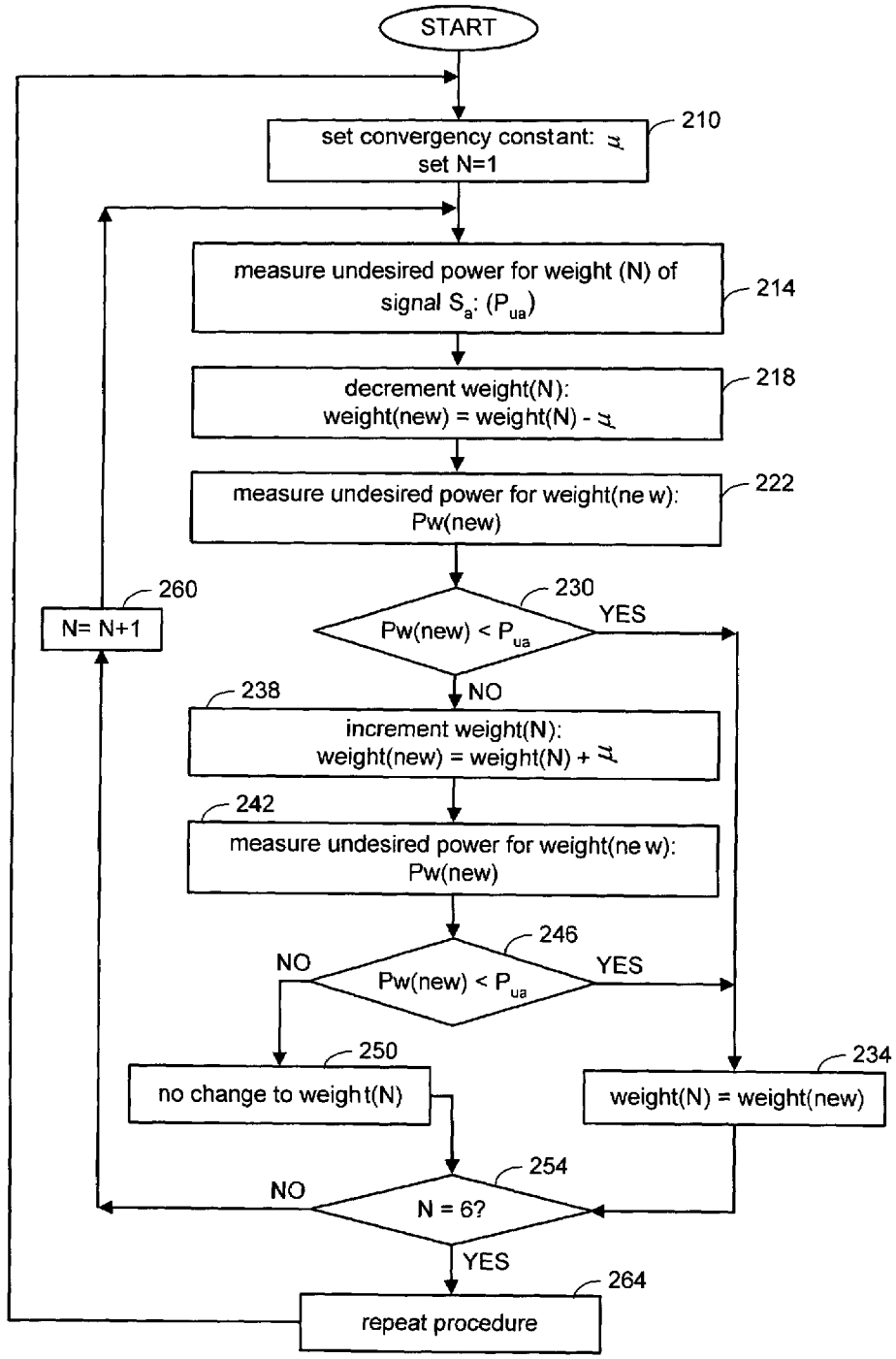
FIG. 8 is a flow chart for the optimization algorithm of the present invention.

FIG. 8 is a flow chart for the optimization algorithm of the present invention. The flow chart illustrates the processing of input data stream $S_a$ but it is understood by one of average skill in the art that input data stream $S_b$ and $S_g$ are updated simultaneously to $S_a$. The algorithm sets the convergency constant to the desired value and sets the counter N equal to one (step 210). The counter N will step, in turn, through each real part (three) and imaginary part (three) weighted vector value until all six parts have been evaluated. The undesired power Pua, is measured for weight (N) with all other input data stream $S_a$ weighted vector values held constant (step

214). Weight (N) is decremented by the convergency constant creating weight (new) and then a new undesired power measurement is made for the new weight (step 218 and step 222).

The algorithm compares the new undesired power measurement to undesired power measurement $P_{ua}$ (step 230). If the new power measurement is lower than $P_{ua}$, the algorithm updates the weighted vector value to the new weight value (step 234). If, however, the new power measurement is higher than $P_{ua}$, the algorithm increments the weighted vector value with the convergency constant (step 238) then measures the undesired power for weight(new), i.e., the incremented weight (step 242). The undesired power for the incremented weight, Pw(new), is compared to the undesired power, $P_{ua}$ (step 246). If Pw(new) is greater than $P_{ua}$, the weighted vector value is not updated (step 250). If Pw(new) is lower than $P_{ua}$, then the weighted vector value is updated to the new weight value (step 234).

The algorithm checks if all six weighted vector values have been updated (step 254) and either increments N (step 260) and continues with the next weighted vector value or repeats the procedure (step 264).

Figure 9:
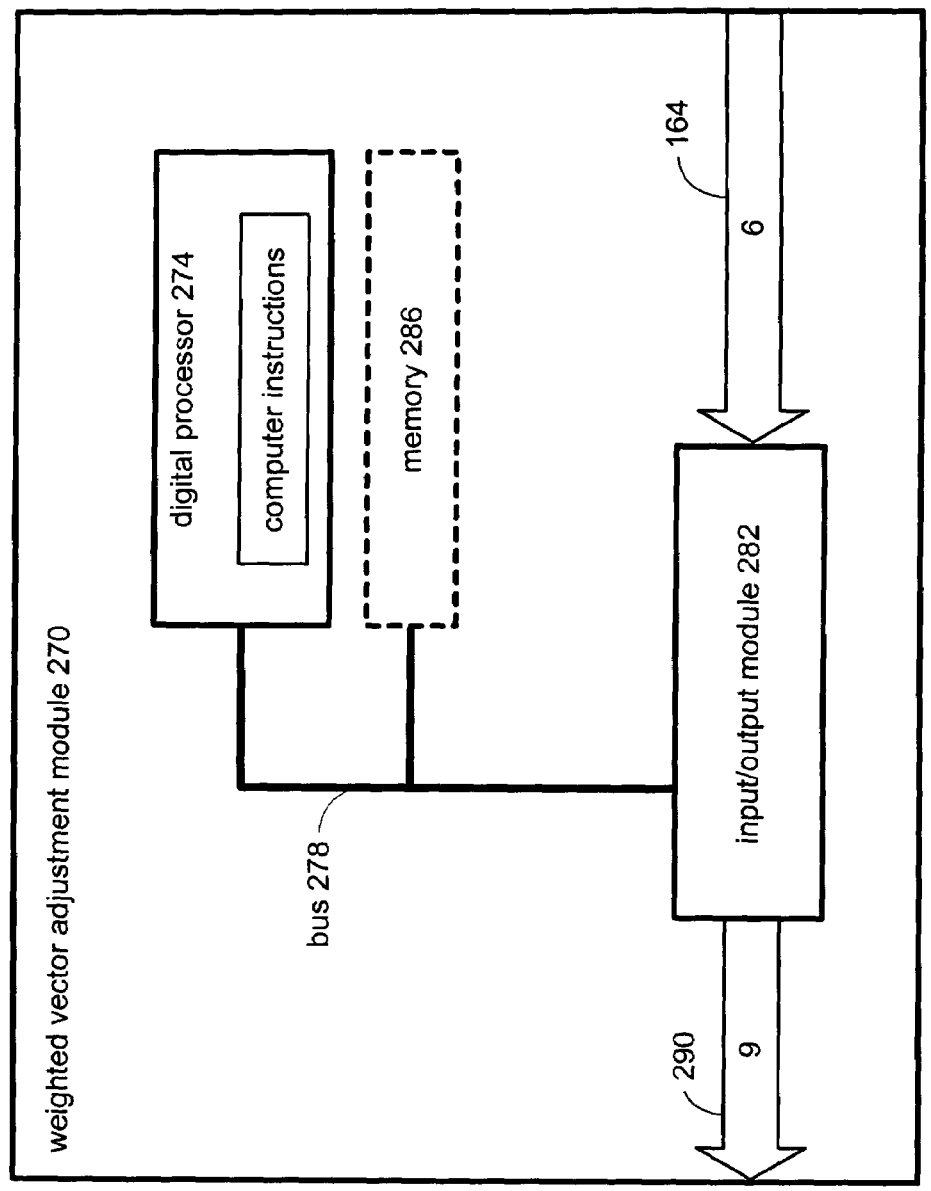
FIG. 9 is a schematic block diagram of a weighted vector adjustment module of the present invention.

FIG. 9 is a functional block diagram of a weighted vector adjustment module of the present invention. Weighted vector adjustment module 270 includes a digital processor 274 that is coupled to communicate over a bus 278. Digital processor 274 is for storing and executing computer instructions that define the operational logic of weighted vector adjustment module 270. Bus 278 is operably coupled to an input/output module 282 that receives a plurality of normalized power feedback signals 164 from the power determination module (power determination module 160 of FIG. 6), the plurality of normalized power feedback signals from the power determination module further including a plurality of undesired power measurements. Input/output module 282 is further coupled to provide the plurality of weighted vector values 290 having real and imaginary parts to the digital hybrid matrix (digital hybrid matrix 120 of FIG. 6) that enables digital hybrid matrix to mix the plurality of weighted vector values with the input data streams thereby optimizing the signal-to-noise ratio. An optional memory 286 is for storing data received from digital processor 274.

In operation, digital processor 274 executes computer instructions to operate according to the logic defined within the computer instructions to generate the plurality of weighted vector values. Additionally, computer instructions stored in digital processor 274 define logic for optimizing the plurality of weighted vector values by adjusting each magnitude and phase component of the plurality of weighted vector values with one of a first increment or a second increment based on increment that results in the lowest undesired signal power level.

Figure 10A:
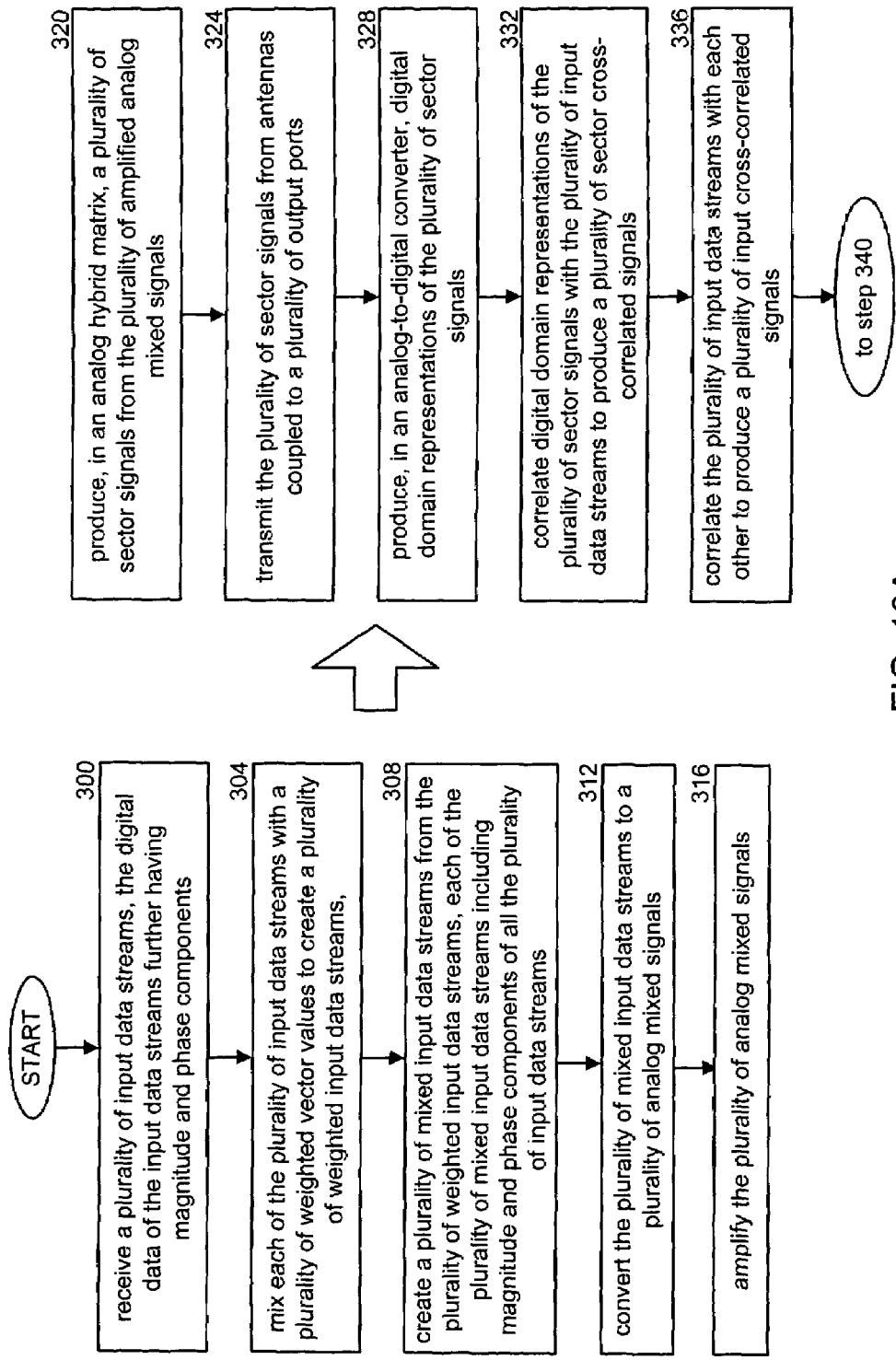
FIGS. 10A and 10B are flow charts of a method in a digitally convertible radio (DCR) for optimizing a signal-to-noise ratio.
Figure 10B:
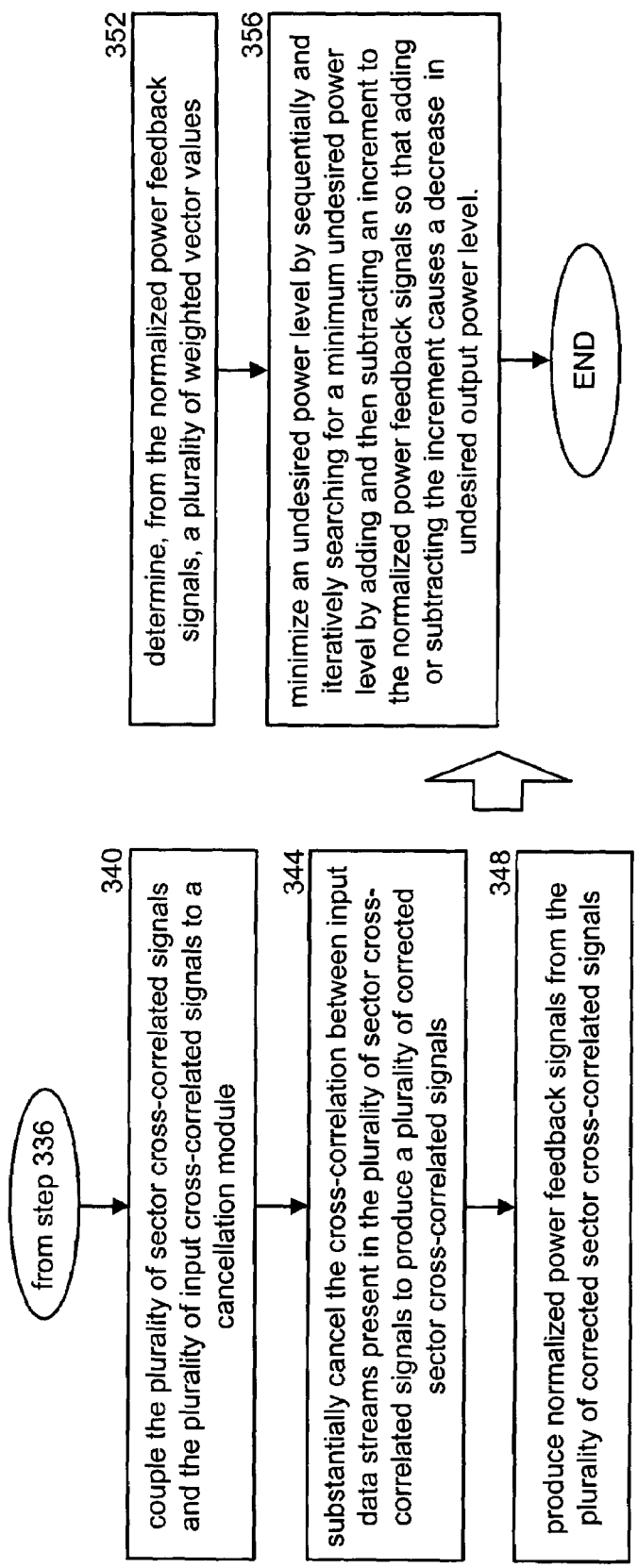

FIGS. 10A and 10B are flow charts of a method in a digitally convertible radio (DCR) for optimizing a signal-to-noise ratio. The DCR receives a plurality of input digital data streams, the digital data of the input data streams further having magnitude and phase components (step 300). The noise component in the signal-to-noise ratio at a particular port comprises the undesired portions of the input data streams present at that port. Each of the plurality of input data streams is mixed with a plurality of weighted vector values to create a plurality of weighted input data streams (step 304). Generally, if there are "N" data streams, $N^2$ weighted data streams are created therefrom. The DCR creates a plurality of mixed input data streams from the plurality of weighted input data streams, each of the plurality of mixed input data streams including magnitude and phase components of all the plurality of input data streams (step 308). The plurality of weighted vector values function to optimize the signal-to-noise ratio by minimizing the undesired components (noise) at the sector ouput ports. Additionally, the weighted vector values further compensate for analog phase and amplitude errors generated downstream from the DCR.

The plurality of mixed input data streams are converted to a plurality of analog mixed signals (step 312), amplified (step 314) and coupled to an analog hybrid matrix to produce a plurality of sector signals from the plurality of amplified analog mixed signals (step 320). Each of the plurality of amplified analog mixed signals include components of the other amplified analog mixed signals. For example, in a three sector system after weight optimization, the first sector signal includes a maximum first sector signal, a minimal second sector signal component, and a minimal third sector signal component. Likewise, the second sector signal includes a maximum second sector signal, a minimal first sector signal component, and a minimal third sector signal component. The third sector signal includes a maximum third sector signal, a minimal first sector signal component, a minimal second sector signal component. The plurality of sector signals are transmitted from antennas coupled to a plurality of output ports (step 324).

At the start of optimization, each sector signal includes portions of all the input data streams. In order to measure the power of each input data stream present in the sector signal, each sector signal is cross-correlated with each input data stream. To optimize the signal-to-noise ratio at a particular sector port, the undesired power of the other sector signals are minimized at that port. The sector signals are coupled to an analog-to-digital converter to produce digital domain representation of the plurality of sector signals (step 328). The digital domain representations of the plurality of sector signals include components of each input data stream as well as phase and magnitude errors introduced by the upstream analog components. The digital domain representations of the plurality of sector signals are correlated with the plurality of input data streams to produce a plurality of sector cross-correlated signals (step 332). The plurality of input data streams is cross-correlated with each other to produce a plurality of input cross-correlated signals (step 336). The plurality of sector cross-correlated signals and the plurality of input cross-correlated signals are then coupled to a cancellation module (step 340) to substantially cancel the cross-correlation between input data streams present in the plurality of measured sector cross-correlated signals to produce a plurality of corrected sector cross-correlated signals (step 344). The canceling function substantially removes, from a single sector measured cross-correlated signal, the correlated components of all other sector cross-correlated signals. The corrected sector cross-correlated signals are coupled to a power determination module which produces normalized power feedback signals from the plurality of correct sector cross-correlated signals (step 348). The weighted vector adjustment module determines a plurality of weighted vector values from the normalized power feedback signals (step 352) by sequentially and iteratively searching for a minimum undesired power level by first subtracting and then adding an increment to the weighted vector values so that one of subtracting or adding the increment causes a decrease in undesired output power level (step 356). Each weighted vector value is updated with the incremented value that causes the decrease in undesired output power level.

The weighted vector value is left unchanged if neither subtracting or adding causes a reduction in undesired power level.

Figure 11:
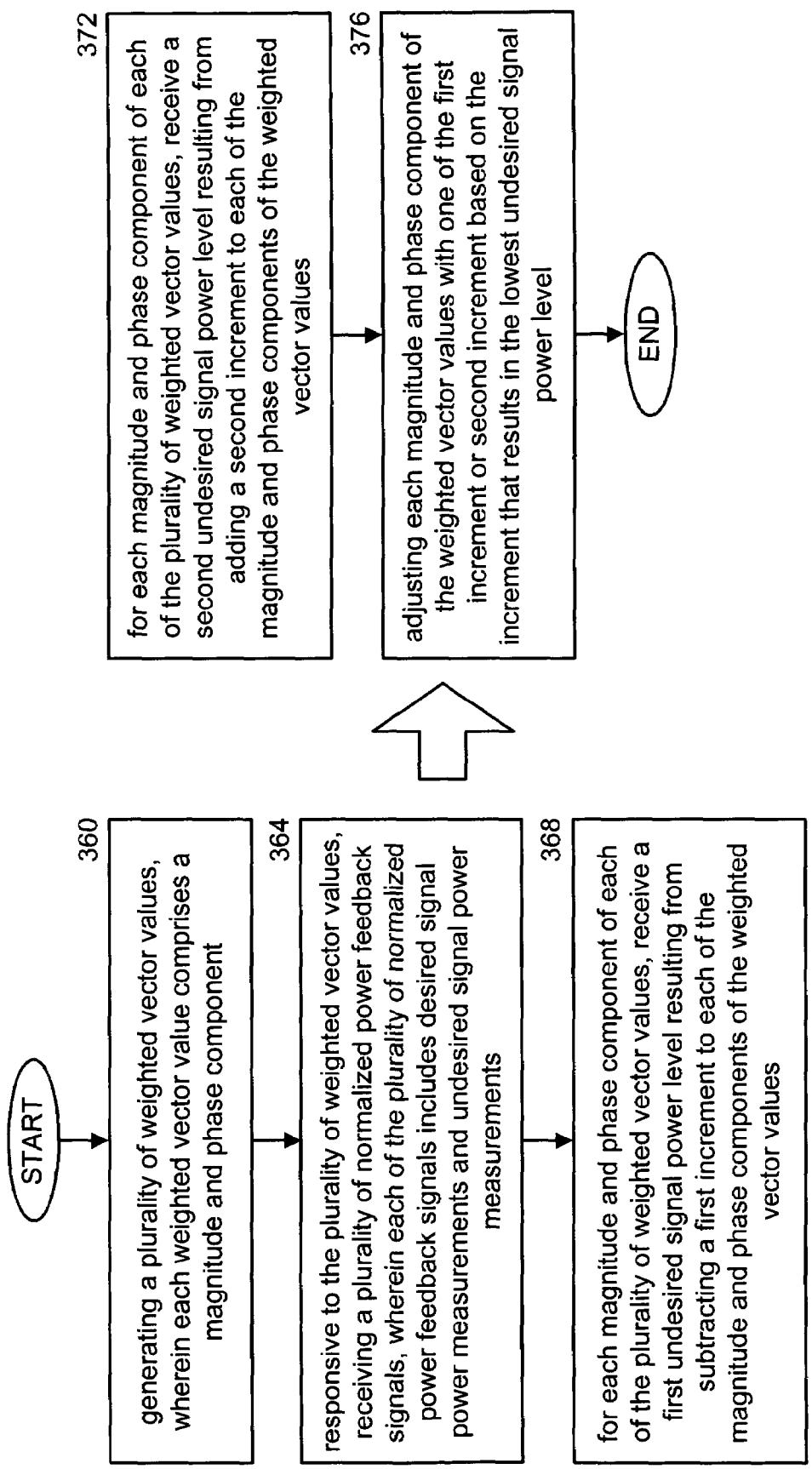
FIG. 11 is a flow chart of an undesired signal minimization method in a digital convertible radio.

FIG. 11 is a flow chart of an undesired signal minimization method in a digital convertible radio. A plurality of input data streams is coupled to the digitally convertible radio (DCR). To minimize the undesired components at each of the sector ports, a DCR weighted vector adjustment module generates a plurality of weighted vector values, wherein each weighted vector value comprises a magnitude and phase component (step 360). Each of the plurality of input data streams is mixed with the plurality of weighted vector values. The weighted vector adjustment module, responsive to the mixing of the plurality of input data streams with the plurality of weighted vector values, receives a plurality of normalized power feedback signals, wherein each of the plurality of normalized power feedback signals includes desired signal power measurements and undesired signal power measurements (step 364). The normalized power feedback signals include cross-correlated components from each of the input data streams. The cross-correlated components include undesired signals that are reduced in order to reach a desired minimized signal level.

In order to cancel the undesired signals, the weighted vector values are adjusted slightly to observe the effect on the undesired signal power level. For each magnitude and phase component of each of the plurality of weighted vector values, receive a first undesired signal power level resulting from subtracting a first increment to each of the magnitude and phase components of the weighted vector values (step 368). For each magnitude and phase component of each of the plurality of weighted vector values, receive a second undesired signal power level resulting from adding a second increment to each of the magnitude and phase components of the weighted vector values (step 372). The first and second increments can be different magnitudes, but are typically equal magnitudes. In one embodiment, the first and second increments have variable magnitudes so the optimization procedure rapidly converges to the minimum undesired signal level. For example, the first and second increment magnitude will be typically set to a relatively large value at the start of the optimization procedure so that the solution converges rapidly. Likewise, when the procedure is nearing a desired optimization level, the increments are set to a smaller value. In an alternate embodiment, the first and second increments have a fixed magnitude. Based on the received normalized power feedback signals, each magnitude and phase component of the weighted vector values are adjusted with one of the first increment or second increment based on the increment resulting in the lowest undesired signal power level (step 376). The undesired signal minimization method runs continuously to remove undesired signals that result from slow changes in phase and magnitude components within the DCR.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A method in a digitally convertible radio (DCR) for optimizing a signal-to-noise ratio (SNR) in a multi-port system, the method comprising:
   receiving a plurality of input digital data streams, the digital data of the input data streams further having magnitude and phase components wherein the plurality is equal to "N" input digital data streams;
   creating a corresponding plurality of mixed input data streams from the plurality of input data streams and a plurality of weighted vector values, each of the plurality of mixed input data streams including magnitude and phase components of all the plurality of input data streams wherein the corresponding plurality is equal to "N";
   converting the plurality of mixed input data streams to a plurality of analog mixed signals;
   amplifying the plurality of analog mixed signals;
   producing, in an analog hybrid matrix, a plurality of sector signals from the plurality of amplified analog mixed signals, respectively, wherein:
      the first sector signal comprising a maximum first sector signal, a minimal second sector signal component, and a minimal third sector signal component;
      the second sector signal comprising a maximum second sector signal, a minimal first sector signal component, and a minimal third sector signal component; and
      the third sector signal comprising a maximum third sector signal, a minimal first sector signal component, a minimal second sector signal component;
   transmitting the first, second, and third sector signals from antennas coupled to a first output port, a second output port, and a third output port, respectively;
   correlating digital domain representations of the first, second, and third sector signals with the plurality of input data streams to produce a plurality of sector cross-correlated signals;
   correlating the plurality of input data streams with each other to produce a plurality of input cross-correlated signals;
   substantially canceling the cross-correlation between input data streams present in the plurality of sector cross-correlated signals to produce a plurality of corrected sector cross-correlated signals, wherein:
      the step of substantially canceling the cross-correlation substantially removes, from a single sector cross-correlated signal, the correlated components of all other sector cross-correlated signals;
   producing normalized power feedback signals from the plurality of corrected sector cross-correlated signals; and
   determining, from the normalized power feedback signals, a plurality of weighted vector values.

2. The method of claim 1 wherein the step of producing the plurality of sector signals further includes compensating for analog phase and amplitude errors introduced by the steps of converting and amplifying by introducing weighted vector values having magnitude and phase components that substantially corrects for the introduced phase and amplitude errors.

3. The method of claim 1 wherein the digital domain representations of the plurality of sector signals are produced from an analog-to-digital converter prior to the step of correlating the digital domain representations of the plurality of sector signals with the plurality of input data streams.

4. The method of claim 1 further including coupling the plurality of sector cross-correlated signals and the plurality of input cross-correlated signals to a cancellation module, the cancellation module for mixing the input cross-correlated signals with certain sector cross-correlated signals and then subtracting this from the sector cross-correlated signals and thereby producing a plurality of corrected sector cross-correlated signals.

5. The method of claim 4 wherein the step of determining the normalized power feedback signals levels further includes minimizing an undesired power level by sequentially and iteratively searching for a minimum undesired power level by adding and then subtracting an increment to the weights to cause a decrease in undesired output power level.

6. The method of claim 1 wherein the step of creating the plurality of mixed input data streams further includes:

mixing each of the plurality of input data streams with a plurality of weighted vector values to create a plurality of weighted input data streams wherein "N" weighted input data streams are created from each of the plurality of input data streams and further wherein the plurality of weighted input data streams is equal to $N^2$;

summing a first weighted input data stream created from a first input data stream, a first weighted input data stream created from a second input data stream, and a first weighted input data stream created from a third input data stream to produce a first mixed input data stream;

summing a second weighted input data stream created from the first input data stream, a second weighted input data stream created from the second input data stream, and a second weighted input data stream created from the third input data stream to produce a second mixed input data stream; and summing a third weighted input data stream created from the first input data stream, a third weighted input data stream created from the second input data stream, and a third weighted input data stream created from the third input data stream to produce a third mixed input data stream.

7. A digital convertible radio comprising:

a digital hybrid matrix (DHM) for producing a plurality of mixed input data streams from a plurality of input digital data streams and a plurality of weighted vector values, wherein each of the plurality of mixed input data streams includes magnitude and phase components from each of the plurality of input data streams;

an up-conversion module operably coupled to receive the plurality of mixed input data streams from the DHM, the up-conversion module for converting the plurality of mixed input data streams from a digital domain to an analog domain and for up-converting the analog domain signals to a radio frequency (RF) to produce a plurality of analog RF mixed signals;

an amplifier module further including a plurality of amplifiers for receiving and amplifying the plurality of analog RF mixed signals;

an N×N analog hybrid matrix (AHM) coupled to receive the N amplified analog RF mixed signals, the AHM for producing M sector signals, wherein M is equal to or less than N, and wherein each sector signal, of the M sector signals, comprises a maximum component of that sector signal and minimal components of all other sector signals;

a plurality of transmitting antennas for transmitting the M sector signals received from the N×N analog hybrid matrix;

a down-conversion module operably coupled to receive the M sector signals from the ARM, the down-conversion module for:

converting the M sector signals from the analog domain to the digital domain to produce M converted sector signals, wherein the M converted sector signals are digital domain representations of the M sector signals; and down-converting the digital domain signals to a baseband frequency;

a correlation module for producing a $N^2$ sector cross-correlated signals and 2*N input cross-correlated signals from the received M converted sector signals, and from the N received input data streams;

a cancellation module operably coupled to receive $M^2$ sector cross-correlated signals and 2*N input cross-correlated signals and to produce $M^2$ corrected sector cross-correlated signals;

a power determination module operably coupled to receive the $M^2$ corrected sector cross-correlated signals, the power determination module for producing a plurality of normalized power feedback signals from the received $M^2$ corrected sector cross-correlated signals; and a weighted vector adjustment module operably coupled to receive the plurality of normalized power feedback signals, the weighted vector adjustment module further producing a plurality of weighted vector values, wherein the plurality of weighted vector values function to minimize undesired signal components in the plurality of sector signals.

8. The digital convertible radio of claim 7 wherein the up-conversion module further includes:

digital signal processing circuitry for manipulating digital data of the mixed input data streams in the digital domain; and digital-to-analog circuitry for converting the mixed input data streams from the digital domain to, the analog domain.

9. The digital convertible radio of claim 7 wherein the down-conversion module further includes analog-to digital circuitry for converting the plurality of sector signals from the analog domain to the digital domain.

10. The digital convertible radio of claim 7 wherein the weighted vector adjustment module further includes:

a digital processor, comprising one of a microprocessor, microcontroller, application specific integrated circuit (ASIC), or field programmable gate array (FPGA), or other processor, the digital processor for:

storing and executing computer instructions that define operational logic of the weighted vector adjustment module;

receiving and processing the plurality of normalized power feedback signals; and generating the plurality of weighted vector values;

a bus coupled to the digital processor for transmitting computer instructions and control signals to and from the digital processor within the weighted vector adjustment module;

memory coupled to the bus, the memory for storing data; and an input/output module for receiving the plurality of normalized power feedback signals and for coupling the plurality of weighted vector values to the DHM.

11. The digital convertible radio of claim 10 wherein the digital processor further includes logic for optimizing the plurality of weighted vector values, wherein:

for each magnitude and phase component of each of the plurality of weighted vector values, the digital convertible radio measures a first undesired signal power level resulting from subtracting a first increment from each of the weighted vector values;

for each magnitude and phase component of each of the plurality of weighted vector values, the digital convertible radio measures a second undesired signal power level resulting from adding a second increment to each of the weighted vector values; and wherein the digital convertible radio adjusts each magnitude and phase component of the weighted vector value with one of the first increment or second increment that results in the lowest undesired signal power level.

12. The digital convertible radio of claim 11 wherein the first and second increments comprises one of an equal magnitude or an unequal magnitude.

13. The digital convertible radio of claim 11 wherein the first and second increments are a fixed magnitude.

14. The digital convertible radio of claim 11 wherein the first and second increments have a variable magnitude, wherein the variable magnitude changes based on digital convertible radio metrics.

15. The digital convertible radio of claim 7 wherein the DHM further includes:

a plurality of complex multipliers, each complex multiplier operably coupled to received one of the plurality of weighted vector values, and further coupled to receive one of the plurality of input data streams and to produce therefrom a plurality of weighted input data streams;

a plurality of summation units operably coupled to receive the plurality of weighted input data streams and produce therefrom a plurality of mixed input data streams; and wherein each of the mixed input data streams includes magnitude and phase components of each of the plurality of input data streams.

16. The digital convertible radio of claim 7 wherein the analog hybrid matrix separates based on the weight values in the DHM the analog components of the amplified analog mixed signals into a plurality of sector signals for transmission to a corresponding sector antenna.

17. A weighted vector adjustment module of a digital convertible radio, comprising:

a digital processor for storing and executing computer instructions that define operational logic for processing a plurality of normalized power feedback signals, the digital processor further including computer instructions that define logic for generating a plurality of weighted vector values;

a bus coupled to the digital processor for transmitting signals to and from the digital processor within the weighted vector adjustment module;

an input/output module coupled to the bus, the input/output module for receiving the plurality of normalized power feedback signals from a power determination module and for coupling the plurality of weighted vector values to a digital hybrid matrix (DHM); and memory coupled to the bus, the memory for storing data.

18. The digital convertible radio of claim 17 wherein the digital processor further includes logic for optimizing the plurality of weighted vector values, and wherein:

for each magnitude and phase component of each of the plurality of weighted vector values, the digital convertible radio measures a first undesired signal power level resulting from adding a first increment to each of the weighted vector values;

for each magnitude and phase component of each of the plurality of weighted vector values, the digital convertible radio measures a second undesired signal power level resulting from subtracting a second increment to each of the weighted vector values; and wherein the weighted vector adjustment module adjusts each magnitude and phase component of the weighted vector values with one of the first increment or second increment that results in the lowest undesired signal power level at the sector ports.

19. The digital convertible radio of claim 17 wherein the first and second increments are one of an equal magnitude or an unequal magnitude.

20. The digital convertible radio of claim 19 wherein the first and second increments have one of a fixed or a variable magnitude, wherein the variable magnitude changes based on digital convertible radio metrics.

21. An undesired signal minimization method in a digital convertible radio, the method comprising:

generating a plurality of weighted vector values, wherein each weighted vector value comprises a magnitude and phase component;

responsive to the plurality of weighted vector values, receiving a plurality of normalized power feedback signals, wherein each of the plurality of normalized power feedback signals includes desired signal power measurements and undesired signal power measurements;

for each magnitude and phase component of each of the plurality of weighted vector values, receive a first undesired signal power level resulting from subtracting a first increment from each of the magnitude and phase components of the weighted vector values;

for each magnitude and phase component of each of the plurality of weighted vector values, receive a second undesired signal power level resulting from adding a second increment to each of the magnitude and phase components of the weighted vector values; and adjusting each magnitude and phase component of the weighted vector values with one of the first increment or second increment based on the increment that results in the lowest undesired signal power level.

22. The method of claim 21 wherein the first and second increments are one of an equal magnitude or an unequal magnitude.

23. The method of claim 21 wherein the first and second increments have one of a fixed or a variable magnitude, wherein the variable magnitude changes based on digital convertible radio metrics.

* * * * *